United States Patent
Patel et al.

(10) Patent No.: US 8,610,176 B2
(45) Date of Patent: Dec. 17, 2013

(54) STANDARD CELL ARCHITECTURE USING DOUBLE POLY PATTERNING FOR MULTI VT DEVICES

(75) Inventors: Prayag B. Patel, San Diego, CA (US); Pratyush Kamal, San Diego, CA (US); Foua Vang, San Diego, CA (US); Chock H. Gan, San Diego, CA (US); Pr Chidambaram, San Diego, CA (US); Chethan Swamynathan, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 351 days.

(21) Appl. No.: 13/004,460

(22) Filed: Jan. 11, 2011

(65) Prior Publication Data

US 2012/0180016 A1    Jul. 12, 2012

(51) Int. Cl.
*H01L 27/00* (2006.01)
*H01L 21/768* (2006.01)

(52) U.S. Cl.
USPC ............ 257/202; 257/E27.001; 257/E21.575; 438/128; 438/587; 716/121

(58) Field of Classification Search
USPC .......... 257/202, 204, 208, E27.001, E21.575; 438/128, 587; 716/119, 121
See application file for complete search history.

(56) References Cited

U.S. PATENT DOCUMENTS

| | | | |
|---|---|---|---|
| 6,787,469 B2 | 9/2004 | Houston et al. | |
| 7,100,135 B2 | 8/2006 | Meyer et al. | |
| 7,340,712 B2 | 3/2008 | Correale, Jr. | |
| 2007/0083842 A1 | 4/2007 | Namba et al. | |
| 2008/0224176 A1 | 9/2008 | Nakanishi et al. | |
| 2009/0166746 A1 | 7/2009 | Mitani et al. | |
| 2009/0169832 A1* | 7/2009 | Aton | 428/195.1 |
| 2010/0068652 A1 | 3/2010 | Takahata | |
| 2010/0095252 A1 | 4/2010 | Schultz | |
| 2010/0164614 A1 | 7/2010 | Hou et al. | |
| 2010/0306719 A1 | 12/2010 | Smayling | |

OTHER PUBLICATIONS

International Search Report and Written Opinion—PCT/US2012/020993—ISAEPO—Apr. 27, 2012.

* cited by examiner

*Primary Examiner* — Julio J Maldonado
*Assistant Examiner* — Daniel Shook
(74) *Attorney, Agent, or Firm* — Sam Talpalatsky; Nicholas J. Pauley; Joseph Agusta

(57) ABSTRACT

An apparatus fabricated using a standard cell architecture including devices having different voltage thresholds may include a first set of polylines associated with a first channel length, where each polyline within the first set of polylines is separated by a substantially constant pitch. The apparatus may further include a second set of polylines associated with a second channel length and aligned with the first set of polylines, where each polyline within the second set of polylines is laterally separated by the substantially constant pitch. The apparatus may further include a first active region below the first set of polylines, and a second active region below the second set of polylines, where the first active region and the second active region are separated by a distance of less than 170 nm.

22 Claims, 4 Drawing Sheets ial representation. Cell-based methodologies allow designers to focus on the high-level aspect of design. A standard cell can be made up of a group of transistor structures, passive structures, and interconnect structures that make up atomic functions such as logic functions, storage functions or the like. When the cell design is completed, fabrication may be performed to carry out the physical implementation.

STANDARD CELL ARCHITECTURE USING DOUBLE POLY PATTERNING FOR MULTI VT DEVICES

FIELD OF DISCLOSURE

Embodiments are directed to semiconductor devices, and, more specifically, to groups of devices, having architectures designed using standard cell libraries, which are configured to operate at different threshold voltages.

BACKGROUND

In semiconductor design, standard cell methodology typically involves designing integrated circuits having various functionality using standard components and interconnect structures. These activities are typically facilitated within a computer aided design environment. Standard cell methodology uses abstraction wherein low level integrated circuit synthesis is replaced by a more abstract, higher-level functional representation. Cell-based methodologies allow designers to focus on the high-level aspect of design. A standard cell can be made up of a group of transistor structures, passive structures, and interconnect structures that make up atomic functions such as logic functions, storage functions or the like. When the cell design is completed, fabrication may be performed to carry out the physical implementation.

Polylines are graphical objects offered as part of conventional computer aided design packages. Polylines may be used during the design stage to define features associated with devices that are patterned onto semiconductors. During fabrication, the polylines may be formed onto the semiconductor and subsequently altered in various stages in the process of realizing the devices.

The width of the polyline typically determines the channel length of devices within the cells, and thus influences their threshold voltage value VT. Due, in part, to the resolution issues associated with conventional photolithographic equipment, it is customary, when designing certain devices such as integrated transistor devices, to use uniform sized polylines having the same channel length for devices in a particular pattern. Since devices associated with the polyline are designed to operate from the same voltage VT, and since the resolution has been historically insufficient to allow deviations from the conventional approach, convention standard cell library design has seldom been questioned.

In some instances, it may be advantageous to fabricate devices having differing channel lengths (and thus differing threshold voltages) on a common semiconductor substrate. This effort entails patterning polylines having differing line widths over separate active regions. Existing patterning techniques may be used to realize such devices, however, they can result in polylines having tapering characteristics in the region where the channel length changes. Such tapering may lead to undesirable process variation, and can increase the spacing between the active regions to values over 170 nm, which can lead to inefficiencies in manufacturing and reduced process yields.

SUMMARY

An apparatus fabricated using a standard cell architecture including devices having different voltage thresholds is presented.

In one embodiment, the apparatus may include a first set of polylines associated with a first channel length, wherein each polyline within the first set of polylines is separated by a substantially constant pitch. The apparatus may further include a second set of polylines associated with a second channel length and aligned with the first set of polylines, wherein each polyline within the second set of polylines is laterally separated by the substantially constant pitch. The apparatus may further include a first active region below the first set of polylines, and a second active region below the second set of polylines, wherein the first active region and the second active region are separated by a distance of less than 170 nm.

In another embodiment, a plurality of devices associated with a standard cell architecture and fabricated by the process is presented. The process may include providing a plurality of polylines over a first active region and a second active region, wherein each polyline is separated by a substantially constant pitch, and further wherein the first active region and the second active region are separated by a distance of less than 170 nm. The process may further include forming the plurality of polylines so that each polyline is associated with a first channel length and a second channel length, and separating the polylines into a first set of polylines and a second set of polylines, wherein the first set of polylines is associated with the first channel length, and the second set of polylines is associated with the second channel length.

BRIEF DESCRIPTION OF THE DRAWINGS

The accompanying drawings are presented to aid in the description of embodiments. The drawings are provided solely for illustration of the embodiments and not limitation thereof.

DETAILED DESCRIPTION

Aspects are disclosed in the following description and related drawings directed to specific embodiments. Alternate embodiments may be devised without departing from the scope of the invention. Additionally, well-known elements will not be described in detail or will be omitted so as not to obscure the relevant details.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

In connection with the present disclosure, the term "polyline" may refer to a graphical object available in a computer aided design (CAD) system for representing lines (open polyline) and/or for polygonal objects such as transistor gates, circuit traces and the like (closed polyline). The phrase "double polyline patterning" may refer to the use of successive polylines to specify corresponding successive patterning steps during fabrication to form irregular features or features having a finer resolution than normally possible with the current fabrication or lithography scale. Various means can be appreciated as means for specifying the cell libraries and generating output file formats as described herein including but not limited to freeware software design systems such as Magic design system, Electric VLSI design system, and commercially available systems such as the family of IC design systems offered by Mentor Graphics, Inc. such as Design Architect IC, IC Station, Quicksim II, Mach TA/Accusim II, systems offered by Cadence® Design Systems such as Composer, Verilog-XL, Virtuoso, Silicon Ensemble, Spectre and systems offered by Tanner Research, Inc. such as S-Edit, L-Edit, LVS, T-Spice.

Figure 1:
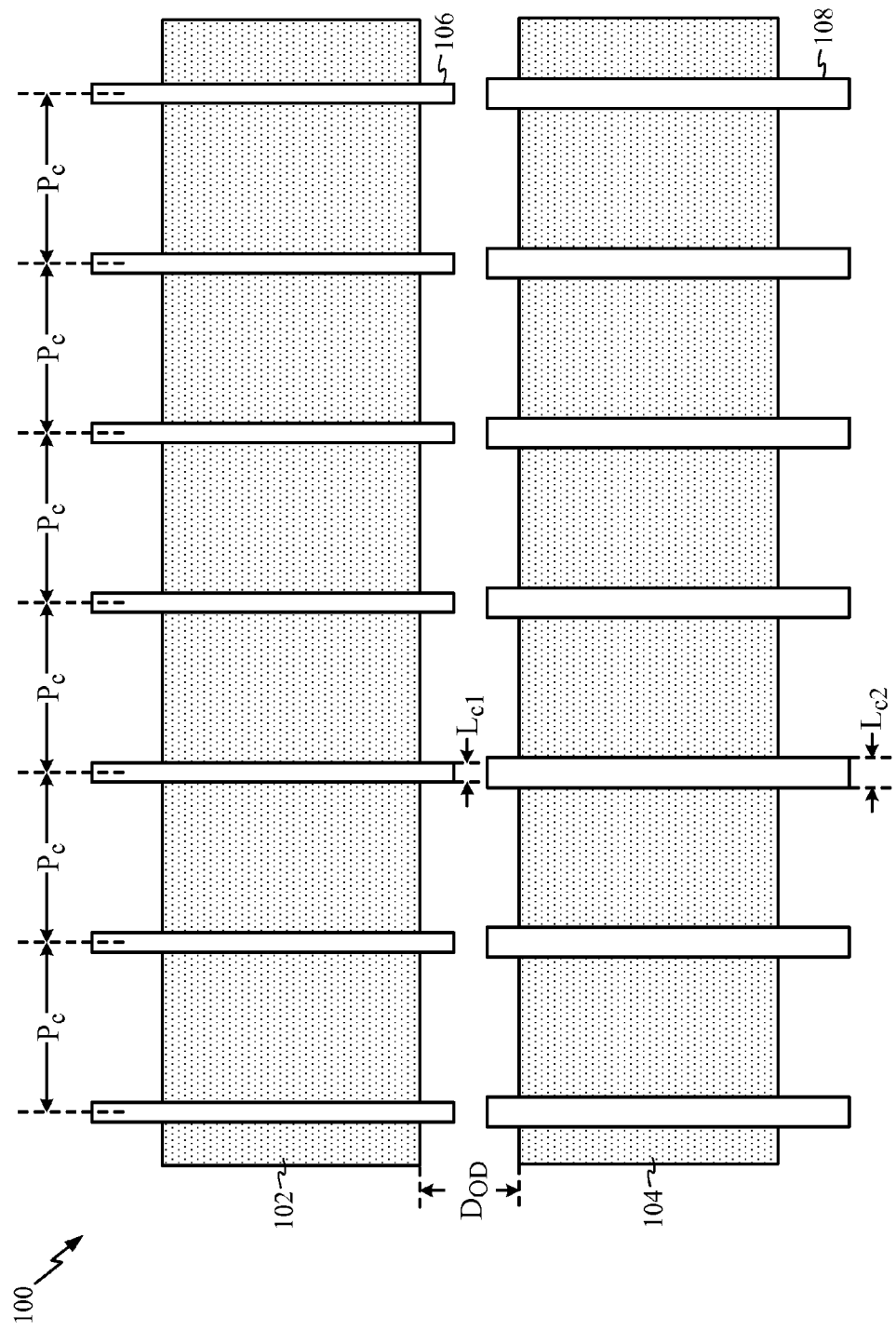
FIG. 1 is a diagram illustrating a semiconductor using a standard cell library design having polylines separated by a constant pitch with different channel lengths.

FIG. 1 is a diagram illustrating a semiconductor device 100 which may be fabricated using a double polyline process based upon a standard cell library design. The device 100 may include a first active region 102, a second active region 104, a first set of polylines 106, and a second set of polylines 108. The first set of polylines 106 and the second set of polylines 108 have different widths, which are expressed herein as channel lengths Lc. As noted above, the channel length is typically proportional to the threshold voltage ($V_T$) of devices formed in/on the active regions of the semiconductor device. The first set of polylines 106 have a first channel length (Lc1). The second set of polylines 108 may have a second channel length (Lc2). As exemplified in FIG. 1, polylines 106 may have a channel length Lc1 which is smaller than the channel length Lc2 of polylines 108. Therefore, devices associated with active region 102 may have a different threshold voltage than the devices associated with active region 104.

Each polyline within the first set of polylines 106 may be laterally separated by a constant distance or pitch (Pc). Each polyline within the second set of polylines 108 may also be laterally separated by the same pitch (Pc). In one embodiment, the second set of polylines 108 may be aligned with the first set of polylines 106, so that the centers of the polylines from each set are aligned. However, other embodiments may contemplate different alignments between the two sets of polylines, for example, where the polylines may be aligned at the left or right edge. Moreover, in other embodiments, the first portions and the second portions of the polylines may be aligned with each other on a per polyline basis.

The first active region 102 may be situated below the first set of polylines 106, and the second active region 104 may be situated below the second set of polylines 108. The distance ($D_{OD}$) between the first active region 102 and the second active region 104 is less than 170 nm, and is preferably 135 nm. While not expressly shown in FIG. 1, it should be understood that each active region may have cells formed thereon which correspond to circuit realizations based upon a standard cell library.

In one embodiment, the first channel length (Lc1) may be in the range between 20 nm and 30 nm. The second channel length (Lc2) may be in the range between 30 nm and 40 nm. The distance between the edge of the first set of polylines and edge of the first active region may be 31.5 nm. The cell pitch Pc may be approximately 140 nm.

Figure 2A:
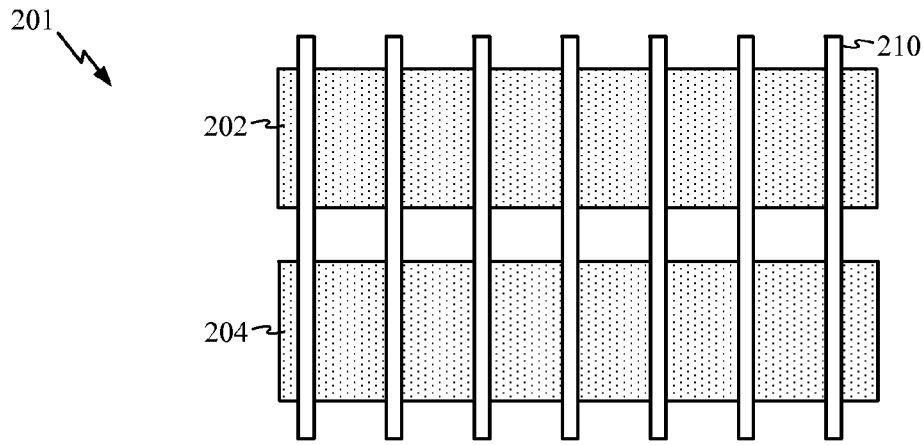
FIGS. 2A-2C are diagrams showing different stages of fabrication of the semiconductor shown in FIG. 1.
Figure 2B:
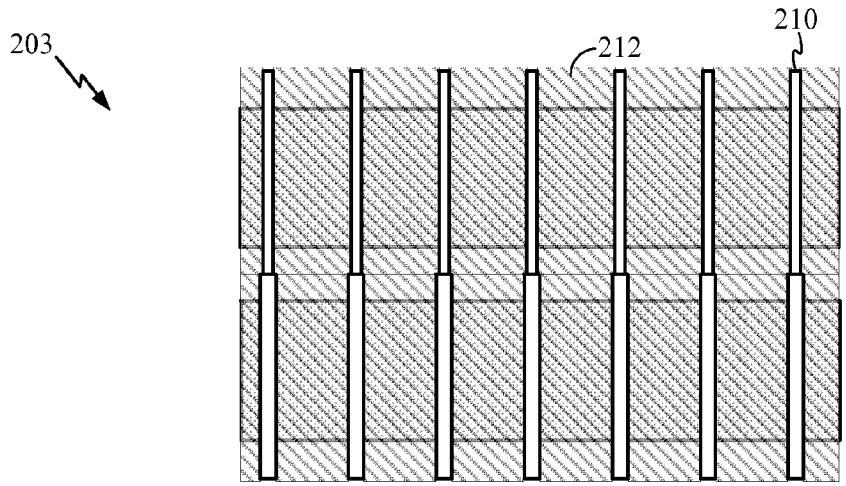
Figure 2C:
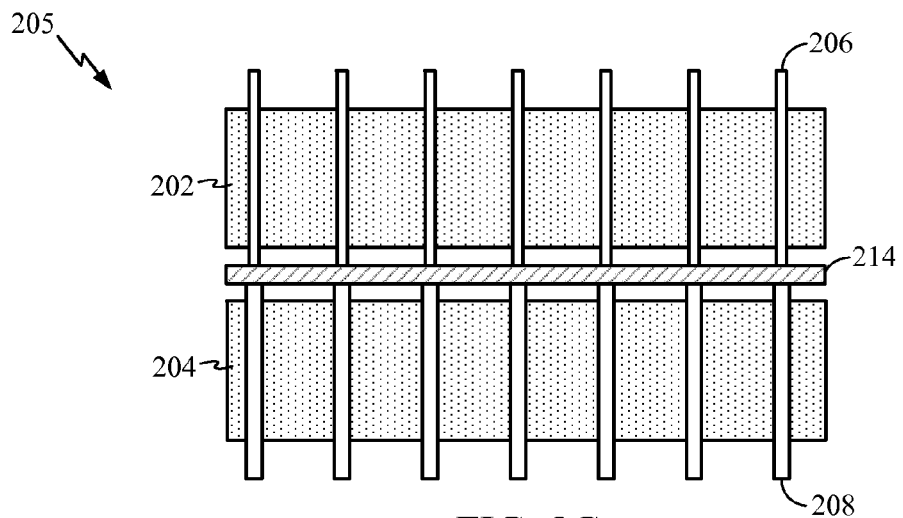

FIGS. 2A-2C are diagrams showing exemplary stages in the fabrication of the semiconductor shown in FIG. 1 using a double patterning process. FIG. 2A shows a stage 201 of the device prior to polyline patterning. At stage 201, all of the polylines 210 may have a single channel length, which can be the length $L_{c2}$ corresponding to thicker set of polylines 108 shown in FIG. 1. However, in other embodiments, the initial channel length of the polylines may start out being thicker than $L_{c2}$. The polylines 210 can extend over both active regions 202 and 204.

FIG. 2B shows an exemplary stage 203 where the first polyline patterning of the semiconductor device takes place. Here, the upper portion of the polylines 210 is patterned so that their channel lengths are reduced to $L_{c1}$. The lower portion of the polylines may be patterned so that their channel lengths are reduced to $L_{c2}$. Note that in the embodiment where the polyline channel lengths were already at the desired second length, the lower portion of polylines may remain unchanged at this stage. In an embodiment, the stepped configuration ($L_{c1}$ and $L_{c2}$) could be formed in one initial patterning step using an appropriately stepped mask 212, which would perform the first patterning.

FIG. 2C shows an exemplary stage 205 where a second patterning separates the polylines into two distinct sets of polylines 206 and 208. The second patterning may be implemented by a second mask 214 to cleanly perform the separation. Using the first mask 212 and the second mask 214 is one exemplary implementation of a double patterning process. The double patterning process may permit the edges of each of the polyline sets 206 and 208, in the region of the space between the two active regions, to remain sharp. In other words, the masking may reduce tapering of the polylines. This permits the spacing between the first active region 202 and the second active region 204 to remain relatively close, and thus improve manufacturing efficiency (through better utilization of the area of the active regions) while reducing process variability. Accordingly, the double patterning used to form the standard cell maximizes the active region's area utilization. In some embodiments, the distance between the first active region 202 and the second active region 204 may be less than 170 nm.

Figure 3:
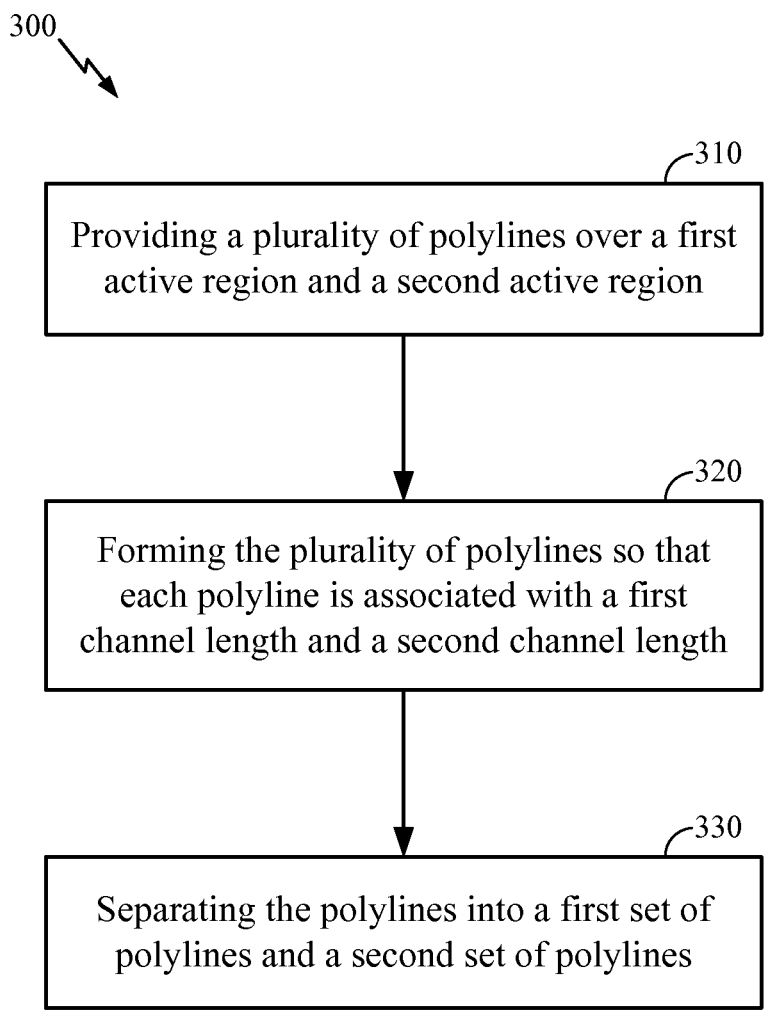
FIG. 3 is a flow chart illustrating an exemplary process for fabricating the semiconductor shown in FIG. 1.

FIG. 3 is a flow chart illustrating an exemplary process 300 for fabricating the semiconductor shown in FIG. 1. In Block 310, the polylines may be patterned using the photo lithography process. In other embodiments, the forming of the polylines may be performed using any type of suitable semiconductor process. During a masking step, a single set of polylines 210 may be formed over both the first active region 202 and the second active region 204. The final dimension may be set by the etch process. As shown in FIG. 2A, each polyline may be separated by a substantially constant pitch ($P_c$). Moreover, the first active region 202 and the second active region 204 may be separated by a distance of less than 170 nm.

In the next Bock 320, the polylines 210 may be formed so that each polyline is associated with both a first channel length and a second channel length. In one embodiment, this may be performed in association with mask 212. Afterward, the polylines 210 may be separated into a first set of polylines 206 and a second set of polylines 208 using a separate mask 214 (Block 330). The second mask may be specified in the standard cell library, and can be an adjuster that refines the respective shapes of the overlapping area while separating polylines 206 and 208 into distinct sets. Accordingly, in accordance with various exemplary embodiments, a cell library specifying double polyline patterning can be used advantageously to specify the construction of devices having different lengths, and thus having different voltage requirements, in the same manufacturing and specification process which further permits closer spacing of the active regions 202 and 204.

It should further be noted that the foregoing disclosed standard cell libraries can be configured into computer files having IC layout specifications according to an output format such as, Caltech Intermediate Format (CIF), Calma GDS interchange format (GDS II), Electronic Design Interchange Format (EDIF), Schematic User Environment (SUE), AutoCAD mechanical format (DXF), VHSIC hardware description language VHDL, hardware description language (Verilog), Cadence® circuit description language (CDL), EAGLE schematic capture interface format, ECAD schematic capture interface format, HPGL plotting language format, Postscript plotting language format, and the like. The specification files are stored on a computer readable media. These files are in turn provided to fabrication handlers who fabricate devices based on these files. The resulting products are semiconductor wafers that are then cut into semiconductor die and packaged into a semiconductor chip. The chips are then employed in devices described above.

Figure 4:
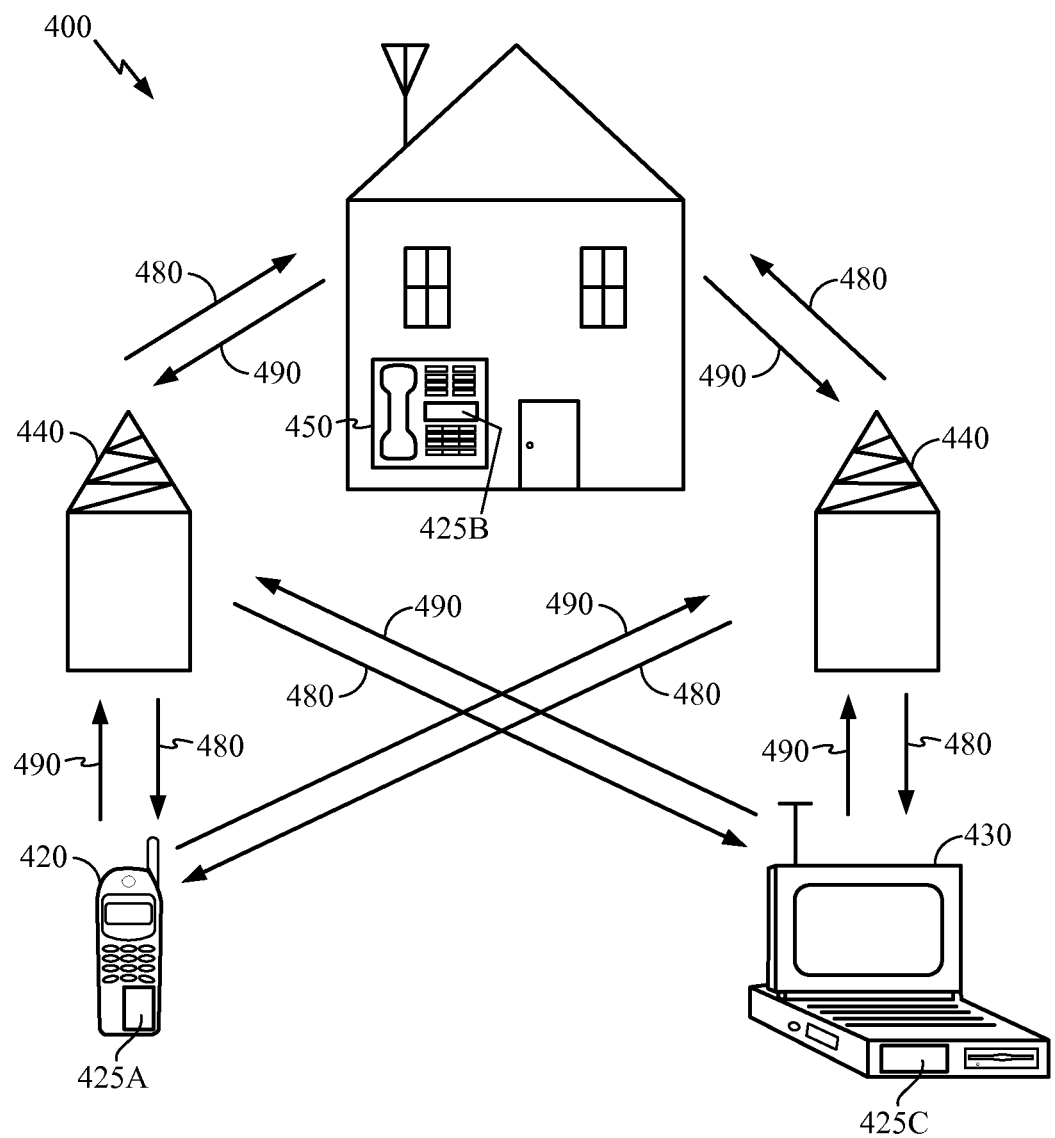
FIG. 4 is a block diagram showing an exemplary wireless communication system in which embodiments of the disclosures may be employed.

FIG. 4 is a block diagram showing an exemplary wireless communication system 400 in which embodiments of the disclosures may be employed. For purposes of illustration, FIG. 4 shows three remote units 420, 430, and 450 and two base stations 440. It is noted that conventional wireless communications systems can have many more remote units and base stations. The remote units 420, 430 and 450 may include devices 425A, 425B and 425C, which are an embodiment of the disclosure as discussed above. FIG. 4 further shows a forward link signals 480 from the base stations 440 and the remote units 420, 440, and 450 and reverse link signals 490 from the remote units 420, 430 and 450 to the base stations 440.

In FIG. 4, remote unit 420 is shown as a mobile telephone, remote unit 430 is shown as a portable computer, and remote unit 450 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 4 illustrates remote units according to the teachings of the disclosure, the disclosure is not limited to these exemplary illustrated units. Embodiments of the disclosure may be suitably employed in any device which includes active integrated circuitry including memory and on-chip circuitry for test and characterization.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. An apparatus fabricated using a standard cell architecture including devices having different voltage thresholds, comprising:
    a first set of polylines associated with a first channel length, wherein each polyline within the first set of polylines is separated by a substantially constant pitch;
    a second set of polylines associated with a second channel length and aligned with the first set of polylines, wherein each polyline within the second set of polylines is laterally separated by the substantially constant pitch, and wherein the first channel length is different from the second channel length;
    a first active region below the first set of polylines; and
    a second active region below the second set of polylines, wherein the first active region and the second active region are separated by a distance of less than 170 nm.

2. The apparatus of claim 1, wherein the distance separating the first active region and the second active region is approximately 135 nm.

3. The apparatus of claim 1, wherein the first set of polylines and the second set of polylines are arranged such that centers of each respective polyline are aligned.

4. The apparatus of claim 1, wherein the first channel length is in a range between 20 nm and 30 nm.

5. The apparatus of claim 4, wherein the second channel length is in a range between 30 nm and 40 nm.

6. The apparatus of claim 1, wherein a distance between an edge of the first set of polylines and an edge of the first active region is approximately 31.5 nm.

7. The apparatus of claim 1, wherein a distance between an edge of the second set of polylines and an edge of the second active region is approximately 31.5 nm.

8. The apparatus of claim 1, wherein the substantially constant pitch is approximately 140 nm.

9. The apparatus of claim 1, wherein a first portion and a second portion of the polylines are aligned with each other on a per polyline basis.

10. The apparatus of claim 1, integrated into a device selected from a group consisting of a set top box, a music player, a video player, an entertainment unit, a navigation device, a communications device, a personal digital assistant (PDA), a fixed location data unit, a computer, and at least one semiconductor die.

11. The apparatus of claim 1, wherein the first set of polylines and the second set of polylines comprise a plurality of polylines that are formed into the first channel length and the second channel length using a first masking, and wherein the plurality of polylines are separated into the first set of polylines and the second set of polylines using a second masking.

12. A plurality of devices associated with a standard cell architecture and fabricated by a process comprising:
    providing a plurality of polylines over a first active region and a second active region, wherein each polyline is separated by a substantially constant pitch, and further wherein the first active region and the second active region are separated by a distance of less than 170 nm;
    forming the plurality of polylines so that each polyline is associated with a first channel length and a second channel length, wherein the first channel length is different from the second channel length; and
    separating the plurality of polylines into a first set of polylines and a second set of polylines, wherein the first set of polylines is associated with the first channel length, and the second set of polylines is associated with the second channel length.

13. The plurality of devices of claim 12, wherein the forming further comprises:
   using a first masking to separate the plurality of polylines into the plurality of polylines into the first channel length and the second channel length.

14. The plurality of devices of claim 13, wherein the separating further comprises:
   using a second masking to form the first set of polylines and the second set of polylines.

15. The plurality of devices of claim 12, wherein the distance separating the first active region and the second active region is approximately 135 nm.

16. The plurality of devices of claim 12, wherein the first channel length is in a range between 20 nm and 30 nm.

17. The plurality of devices of claim 16, wherein the second channel length is in a range between 30 nm and 40 nm.

18. The plurality of devices of claim 17, wherein the substantially constant pitch is approximately 140 nm.

19. The plurality of devices of claim 17, wherein the first set of polylines and the second set of polylines are arranged such that centers of each respective polyline are aligned.

20. The plurality of devices of claim 12, wherein at least one of a distance between an edge of the first set of polylines and an edge of the first active region or a distance between an edge of the second set of polylines and an edge of the second active region is approximately 31.5 nm.

21. The plurality of devices of claim 12, wherein a first portion and a second portion of the polylines are aligned with each other on a per polyline basis.

22. A process for fabricating a plurality of devices associated with a standard cell architecture, comprising:
   providing a plurality of polylines over a first active region and a second active region, wherein each polyline is separated by a substantially constant pitch, and further wherein the first active region and the second active region are separated by a distance of less than 170 nm;
   forming the plurality of polylines so that each polyline is associated with a first channel length and a second channel length, wherein the first channel length is different from the second channel length; and
   separating the plurality of polylines into a first set of polylines and a second set of polylines, wherein the first set of polylines is associated with the first channel length, and the second set of polylines is associated with the second channel length.

\* \* \* \* \*